(12) United States Patent
Walk et al.

(10) Patent No.: US 12,261,730 B2
(45) Date of Patent: Mar. 25, 2025

(54) MULTI-USER INTERLEAVED FREQUENCY-DIVISION MULTIPLEXING FOR BLOCK TRANSMISSIONS

(71) Applicant: Huawei Technologies Co., Ltd., Shenzhen (CN)

(72) Inventors: Philipp Walk, Chicago, IL (US); Weimin Xiao, Hoffman Estates, IL (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 175 days.

(21) Appl. No.: 18/145,585

(22) Filed: Dec. 22, 2022

(65) Prior Publication Data

US 2023/0125428 A1    Apr. 27, 2023

Related U.S. Application Data

(63) Continuation of application No. PCT/US2020/041939, filed on Jul. 14, 2020.

(51) Int. Cl.
*H04L 27/26* (2006.01)
*H03M 13/27* (2006.01)

(52) U.S. Cl.
CPC ........ *H04L 27/2636* (2013.01); *H03M 13/27* (2013.01)

(58) Field of Classification Search
CPC ............................. H04L 27/2636; H03M 13/27
USPC ......................................................... 375/295
See application file for complete search history.

(56) References Cited

U.S. PATENT DOCUMENTS

| | | | |
|---|---|---|---|
| 2004/0066839 A1 | 4/2004 | Choi et al. | |
| 2006/0050664 A1* | 3/2006 | Guey | H04L 5/003 370/329 |
| 2017/0041948 A1 | 2/2017 | Cheng et al. | |
| 2017/0126458 A1 | 5/2017 | Shattil | |
| 2019/0238379 A1 | 8/2019 | Walk et al. | |
| 2020/0052947 A1 | 2/2020 | Sahin et al. | |
| 2020/0177422 A1 | 6/2020 | Ma et al. | |

(Continued)

OTHER PUBLICATIONS

Erik Dahlman et al., "3G Evolution : HSPA and LTE for Mobile Broadband," Jul. 17, 2007, 485 pages, Elsevier.

(Continued)

*Primary Examiner* — Fitwi Y Hailegiorgis
(74) *Attorney, Agent, or Firm* — Slater Matsil, LLP

(57) ABSTRACT

A computer-implemented method for multi-user multiplexing for block transmissions by an electronic device includes generating a user signal that includes a number of first samples in the time domain. The number of first samples are generated based on a discrete-time baseband signal and a predetermined guard period. A discrete Fourier transform (DFT) operation is performed on the number of first samples to obtain a number of second samples in the frequency domain. An interleaving operation is performed on the number of second samples to obtain a number of third samples in the frequency domain. An inverse-DFT (IDFT) operation is performed on the number of third samples to obtain a number of fourth samples in the time domain. A time shifting is performed on the number of fourth samples to obtain a number of shifted fourth samples. A block transmission is sent using the number of shifted fourth samples.

14 Claims, 7 Drawing Sheets

(56) References Cited

U.S. PATENT DOCUMENTS

2020/0244503 A1* 7/2020 Bala ................. H04L 5/0007

OTHER PUBLICATIONS

Utsaw Kumar et al., "A Waveform for 5G: Guard Interval DFT-s-OFDM," Dec. 6, 2015, 6 pages, IEEE.
Philipp Walk et al., "MOCZ for Blind Short-Packet Communication: Basic Principles," Nov. 1, 2019, IEEE Transactions On Wireless Communications, 18 pages, vol. 18, No. 11.
Aws Yonis et al., "Uplink and Downlink of LTE-Release 10 in Cellular Communications," International Journal of Informatics and Communication Technology (IJ-ICT), Jun. 23, 2012, 12 pages, vol. 1, No. 1.

* cited by examiner

MULTI-USER INTERLEAVED FREQUENCY-DIVISION MULTIPLEXING FOR BLOCK TRANSMISSIONS

CROSS-REFERENCE TO RELATED APPLICATIONS

This application is a continuation of International Application No. PCT/US2020/041939, filed on Jul. 14, 2020, entitled "Multi-User Interleaved Frequency-Division Multiplexing for Block Transmissions," application of which is incorporated herein by reference in its entirety.

TECHNICAL FIELD

The present disclosure relates to wireless communication, and more specifically to multi-user interleaved frequency-division multiplexing for block transmissions. Here, block transmissions refer to data transmission methods where the data is mapped to a fixed number of consecutive complex-valued samples of the time-discrete baseband signal.

BACKGROUND

Future cellular networks will have to cope with an increasing demand for multiple user access. Hence, for LTE advanced pro (LTE-A Pro), a new narrow-band internet-of-things (NB-IoT) standard was introduced by the 3rd Generation Partnership Project (3GPP) consortium in Release 13 to tackle such machine-type-communications (MTC). This demand for device access increased in the $5^{th}$ generation (5G) to hundreds of thousand devices, served by one single cell in an urban environment which pushes existing multiple access schemes to their limits. To handle the access, user packets are bundled to smaller sub-bands of bandwidth, e.g., 180 kiloHertz (kHz), by reducing the packet data size to its minimum. However, since every user will have an independent wireless link to the base-station of its serving cell, coherent signaling schemes will create an overhead due to channel estimation, resulting in an ultimate pilot-contamination. If additionally, the link is fast time-varying, due to the large mobility of the users, pilot overhead increases even further.

SUMMARY

The present disclosure is directed to methods and systems for multi-user frequency-division multiplexing for block transmissions. Here, block-transmissions refer to data transmission methods where the data is mapped to a fixed number of consecutive complex-valued samples of the time-discrete baseband signal. The methods and systems as described can be implemented for IoT scenarios in LTE and 5G (new radio) systems.

In a first implementation, a method for multi-user frequency-division multiplexing for block transmissions includes generating a first user signal comprising a plurality of first samples in the time domain, the plurality of first samples are generated based on a first discrete-time baseband signal and a first predetermined guard period; performing a first discrete Fourier transform (DFT) operation on the plurality of first samples to obtain a plurality of second samples in the frequency domain; performing a first interleaving operation on the plurality of second samples to obtain a plurality of third samples in the frequency domain; performing a first inverse-DFT (IDFT) operation on the plurality of third samples to obtain a plurality of fourth samples in the time domain; performing a first time shifting on the plurality of fourth samples to obtain a plurality of shifted fourth samples; and sending a block transmission using the shifted fourth samples.

In a second implementation, an electronic device includes a non-transitory memory storage comprising instructions, and one or more hardware processors in communication with the memory storage, wherein the one or more hardware processors execute the instructions to perform operations including: generating a first user signal comprising a plurality of first samples in time domain, the plurality of first samples are generated based on a first discrete-time baseband signal and a first predetermined guard period; performing a first DFT operation on the plurality of first samples to obtain a plurality of second samples in frequency domain; performing a first interleaving operation on the plurality of second samples to obtain a plurality of third samples in frequency domain; performing a first IDFT operation on the plurality of third samples to obtain a plurality of fourth samples in time domain; performing a first time shifting on the plurality of fourth samples to generate a plurality of shifted fourth samples; and sending a block transmission using the shifted fourth samples.

In a third implementation, a non-transitory computer-readable medium storing computer instructions for multi-user frequency-division multiplexing for block transmissions, that when executed by one or more hardware processors, cause the one or more hardware processors to perform operations including: generating a first user signal comprising a plurality of first samples in time domain, the plurality of first samples are generated based on a first discrete-time baseband signal and a first predetermined guard period; performing a first DFT operation on the plurality of first samples to obtain a plurality of second samples in frequency domain; performing a first interleaving operation on the plurality of second samples to obtain a plurality of third samples in frequency domain; performing a first IDFT operation on the plurality of third samples to obtain a plurality of fourth samples in time domain; performing a first time shifting on the plurality of fourth samples to obtain a plurality of shifted fourth samples; and sending a block transmission using the shifted fourth samples.

The previously described implementation is implementable using a computer-implemented method; a non-transitory, computer-readable medium storing computer-readable instructions to perform the computer-implemented method; and a computer-implemented system comprising a computer memory interoperably coupled with a hardware processor configured to perform the computer-implemented method and the instructions stored on the non-transitory, computer-readable medium.

The details of one or more implementations of the subject matter of this specification are set forth in the accompanying drawings and the description. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION OF ILLUSTRATIVE EMBODIMENTS

Figure 1:
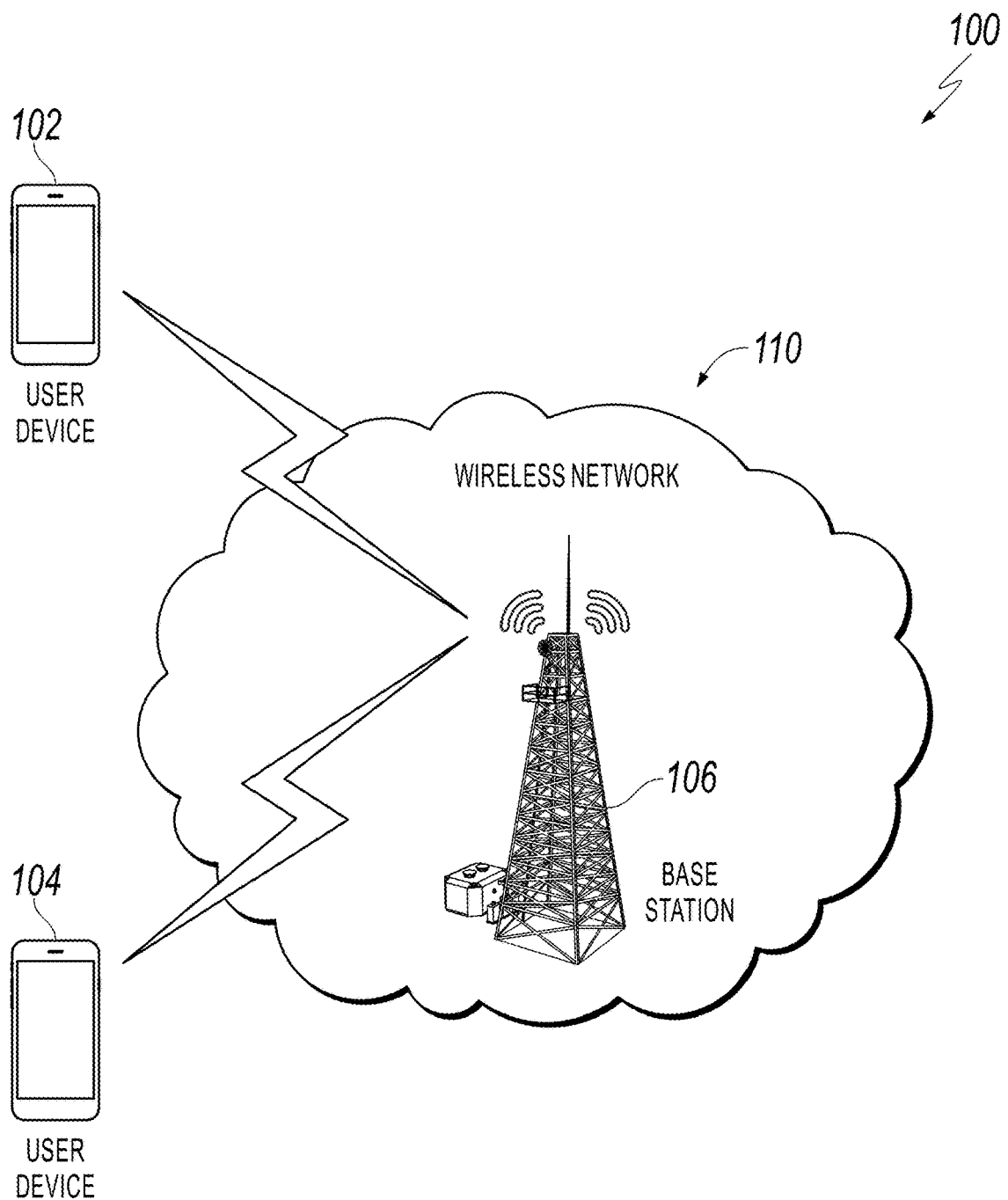
FIG. 1 is an example wireless communication system that performs multi-user frequency-division multiplexing for block transmissions according to an implementation.

The following detailed description describes multi-user frequency-division multiplexing for block transmissions and is presented to enable any person skilled in the art to make and use the disclosed subject matter in the context of one or more particular implementations.

Various modifications, alterations, and permutations of the disclosed implementations can be made and will be readily apparent to those of ordinary skill in the art, and the general principles defined may be applied to other implementations and applications, without departing from the scope of the disclosure. In some instances, details unnecessary to obtain an understanding of the described subject matter may be omitted so as to not obscure one or more described implementations with unnecessary detail inasmuch as such details are within the skill of one of ordinary skill in the art. The present disclosure is not intended to be limited to the described or illustrated implementations, but to be accorded the widest scope consistent with the described principles and features.

MOCZ (modulation on conjugate-reciprocal zeros) is a non-coherent modulation scheme for single carrier (SC) block transmissions. Comparing to a coherent modulation scheme which requires overhead for pilot for channel estimation especially for high mobility cases, MOCZ enables communication without knowledge of the channel impulse response at the receiver and the transmitter and hence without the need for pilot. In the MOCZ modulation scheme, the digital information is modulated onto the K zeros (i.e., roots) of the z-transform (i.e., polynomial) of the K+1 consecutive samples of the time-discrete baseband signal. Since the K zeros can be treated independently, an M-ary modulation scheme can be introduced by allowing M distinct constellations for each transmitted zero to encode log(M) bits per zero and hence K*log(M) bits for a sequence of K+1 time samples, defining the time-discrete baseband signal block. M-ary is intended to refer to any modulation scheme where two or more bits may be transmitted substantially simultaneously. Since a linear-convolution with an unknown time-invariant Channel Impulse Response (CIR) adds only further zeros randomly to the complex plane, an easy separation of data zeros and channel zeros can be obtained almost surely, which solves efficiently and elegantly the channel equalization in the zero-domain without knowledge of the CIR realization at receiver and transmitter. Hence, MOCZ enables a high spectral efficiency without the need for pilot transmissions.

However, a unique separation of channel and user signal is only applicable if different MOCZ symbols/blocks from users are not overlapping in time. Though separating MOCZ symbols from users can also be done via FDM (frequency division multiplexing), it incurs large overhead of guard bands and is not compatible with mainstream cellular systems based on OFDMA (orthogonal frequency-division multiple access). In this specification, a multi-user scheme that utilizes single-carrier FDMA (frequency-division multiple access) techniques is proposed to separate users on distributed carrier sets generated by DFT (discrete Fourier transform) transformations of the received baseband samples, applicable for uplink, downlink, and sidelink. This paves the way for MOCZ to utilize time and frequency resources in a more controllable and flexible manner.

To serve multiple users per block in a single carrier (SC) system, the information of the users can be either separated by time division multiple access (TDMA), where each user gets assigned a certain set of symbols, or by direct-sequence code division multiple access (DS-CDMA), where the information of each user is spread over multiple symbols by using coding with orthogonal spreading-sequences.

If the signal propagates via a time-invariant multi-path channel of coherence bandwidth smaller than the signal's bandwidth, the channel becomes frequency selective. The multi-path propagation can be modeled in the baseband as an additional time-discrete convolution of the time-discrete transmit signal and the channel impulse response having a length of L taps. This results in inter-symbol-interference (ISI), since symbols superposition at the receiver by arriving via different path delays and attenuations. Moreover, to prevent inter-block interference (IBI) a guard-period, which exceeds the channels maximal delay spread of L time-samples, needs to be inserted between successive transmit blocks. To reverse the multipath distortion, sophisticated equalization techniques at the receiver are usually required. To avoid channel equalization in the time domain, the non-coherent modulation scheme MOCZ modulates (maps) the message $m=(m_1, \ldots, m_K) \in \{1 \ldots, M\}^K$ on K complex number $\alpha=(\alpha_1, \ldots, \alpha_K)$. The complex numbers $\alpha_K$ are zeros of the polynomial (z-transform)

$$X(z) = x_K \prod_{k=1}^{K} (z - \alpha_k) = \sum_{k=0}^{K} x_k z^k,$$

and are chosen from constellation set $Z=Z_1 \times Z_2 \ldots \times Z_K$, where $Z_K = \{\alpha_k^{(1)}, \ldots, \alpha_K^{(log(M))}\}$ are a K disjoint complex set with log(M) distinct elements each. The K+1 coefficients $x_k$ of the polynomial X(z) define the time-discrete baseband signal $x=(x_0, x_1, \ldots, x_K)$, known as the MOCZ symbol.

The zero-constellation sets $Z_K = \{\alpha_k^{(1)}, \ldots, \alpha_k^{(log(M))}\}$, for $k=1, \ldots, K$, are distinct points in the complex-plane and define the possible $M^K$ zero-constellations, which in turn define the $M^K$ different M-ary MOCZ symbols. The constellation sets $Z_1, Z_2, \ldots, Z_K$ for the K transmitted zeros can be separated and ordered by partitioning the complex-plane in K uniform slices. Keeping the minimal pairwise distance of all possible zero-locations as large as possible by keeping them at the same time as close as possible to the unit circle, results in good noise and channel robustness and hence in a reliable detection at the receiver. This modulation can be also seen as a non-linear CDMA technique, which is robust against multi-path distortion and obtains a much higher spectral efficiency.

However, TDMA, DS-CDMA, and MOCZ require synchronization of all users to avoid inter-symbol-interference. Since such a user equipment (UE) synchronization and scheduling is hard to realize in an uplink of hundreds of UEs, a time-overlap between different users is very likely. To avoid inter-symbol-interference caused by different users and by multi-path propagations, a separation in frequency, known as frequency division multiple access (FDMA), is much more appropriated. In fact, the resources, in 4G and 5G cellular networks, are always allocated on a time-frequency grid which allows the use of efficient scheduling protocols. Here, the frequency band is separated into orthogonal subcarriers. By using phase-shifted pulses of a rectangular baseband pulse, a modulation on the orthogonal subcarriers in the frequency domain with a predetermined subcarrier spacing is possible, known as orthogonal frequency division multiplexing (OFDM). To avoid inter-block interference and to transform the time-discrete signal to the frequency domain by the unitary discrete Fourier transform (DFT), a cyclic-prefix (CP) can be added to the baseband signal. The received time-discrete baseband signal is then given in the frequency domain by a circular convolution. In a multi-user system of a number of U users, each user may want to communicate a binary message of B bits. This requires $I=B=\log(M)$ symbols/subcarriers to encode the message of a single user and $N=I*U$ to encode the bits of all users in one OFDM symbol, which is known as orthogonal frequency division multiple access (OFDMA). The I subcarriers can be either distributed or localized over the band. However, one drawback of such a multi-carrier modulation is the high peak-to-average-power ratio (PAPR) of the transmitted baseband signal, which scales with the number of subcarriers. A high PAPR becomes more important in an uplink for users with low power and less complex hardware requirements.

In this specification, an interleaved frequency-division multiplexing technique for a multi-user MOCZ system is introduced to improve the PAPR of the multiplexed MOCZ symbols. Note that FIGS. 1-7 are described with references to a MOCZ system for illustrative purpose only. The interleaved frequency-division multiplexing technique as described herein can be applied to any suitable block transmission schemes, e.g., orthogonal signals.

FIG. 1 is an example wireless communication system 100 that performs multi-user frequency-division multiplexing for block transmissions according to an implementation. As an example of multi-user frequency-division multiplexing for block transmissions, an apparatus may modulate a number of information bits of a message from a first user and generate a discrete-time baseband signal (e.g., a MOCZ symbol). In some cases, the apparatus may receive messages associated with multiple users and generate multiple MOCZ symbols accordingly. The apparatus may encode the information bits of the messages in the zeros of a polynomial (z-transform) whose coefficients represent the MOCZ symbol. The apparatus may further add a guard period to the MOCZ symbol. In some cases, the MOCZ symbol with the guard period may be converted to a signal in frequency domain, for example, by performing a DFT operation on the MOCZ symbol with the guard period. In some cases, the DFT samples of the converted signal may be interleaved over subcarriers to generate a multi-user MOCZ signal in the frequency domain. Here, an interleaving or uniform distributing method can be used, where the samples/subcarriers of each user are spaced evenly over the available subcarriers with a given offset in frequency. An inverse DFT and time shifting may be performed on the multi-user MOCZ signal in the frequency domain to generate a shifted multi-user MOCZ signal in the time domain. The apparatus may further generate a continuous-time signal based on the shifted multi-user MOCZ signal in the time domain, and transmit the continuous-time signal over the network.

As another example, the apparatus may receive a shifted multi-user MOCZ signal in the time domain. In some cases, a time offset may be added to the received signal to reverse the time shift. The apparatus may further perform DFT operation, de-interleaving operation, and inverse DFT (IDFT) operation as described herein to obtain the received MOCZ symbols for respective users. In some cases, the apparatus may decode the MOCZ symbols to obtain the messages encoded in respective MOCZ symbols.

As shown, the example wireless communication system 100 includes user devices 102 and 104, and a wireless communication network 110, which includes a base station 106 that is configured to communicate with the user devices 102 and 104. Note that the wireless communication system 100 is illustrated to include two user devices 102 and 104 for illustrative purposes only. The wireless communication system 100 can include any suitable number of user devices. In the illustrated example, each one of the user devices 102 and 104, and the base station 106 may be implemented as an example of the above-described apparatus configured to perform multi-user MOCZ.

For uplink transmission, each one of user devices 102 and 104 as well as additional user devices may generate a shifted MOCZ signal based on a respective MOCZ symbol using the above-described procedure. In some cases, the user devices 102 and 104 may send their respective shifted MOCZ signal to the base station 106 simultaneously or with a time offset from each other. In some cases, the base station 106 may receive a composite MOCZ signal based on the received shifted MOCZ signal from the user devices 102 and 104.

For downlink transmission, the base station 106 may generate a multi-user shifted MOCZ signal based on multiple MOCZ symbols, and send the multi-user shifted MOCZ signal over the network 110. Each one of the user devices 102 and 104 as well as additional user devices may receive the multi-user shifted MOCZ signal and obtain a respective MOCZ symbol using the above-described procedure. The multi-user MOCZ scheme allows multiple MOCZ symbols to be multiplexed at the transmitter in a way such that a separation of the MOCZ symbols can be achieved at the receiver.

In some cases, the interleaving operation as described herein may introduce a shift in the frequency domain, which results in a phase shift in the time domain. In some cases, the time-domain phase shift may reduce the PAPR of the multi-user MOCZ signal significantly. As noted above, a guard period was added to each MOCZ symbol, which facilitates mitigating inter-block-interference between successive user symbols.

Turning to a general description of the elements, a user device may be referred to as a mobile electronic device, user device, mobile station, subscriber station, portable electronic device, mobile communications device, wireless modem, or wireless terminal. Examples of a UE (e.g., the UEs 102 and 104) may include a cellular phone, personal data assistant (PDA), smart phone, laptop, tablet personal computer (PC), pager, portable computer, portable gaming device, wearable electronic device, or other mobile communications device having components for communicating voice or data via a wireless communication network. The wireless communication network may include a wireless link over at least one of a licensed spectrum and an unlicensed spectrum.

Other examples of a user device include mobile and fixed electronic devices. A UE may include a Mobile Equipment (ME) device and a removable memory module, such as a Universal Integrated Circuit Card (UICC) that includes a Subscriber Identity Module (SIM) application, a Universal Subscriber Identity Module (USIM) application, or a Removable User Identity Module (R-UIM) application. The term "user device" can also refer to any hardware or software component that can terminate a communication session for a user.

The wireless communication network 110 may include one or a plurality of radio access networks (RANs), core networks (CNs), and external networks. The RANs may comprise one or more radio access technologies. In some implementations, the radio access technologies may be Global System for Mobile communication (GSM), Interim Standard 95 (IS-95), Universal Mobile Telecommunications System (UMTS), CDMA2000 (Code Division Multiple Access), Evolved Universal Mobile Telecommunications System (UMTS), Long Term Evaluation (LTE), LTE Advanced, or 5G. In some instances, the core networks may be evolved packet cores (EPCs).

A RAN is part of a wireless telecommunication system that implements a radio access technology, such as UMTS, CDMA2000, 3GPP LTE, 3GPP LTE-A, and 5G. In many applications, a RAN includes at least one base station 106. A base station 106 may be a radio base station that may control all or at least some radio-related functions in a fixed part of the system. The base station 106 may provide radio interface within their coverage area or a cell for the user devices 102 and 104 to communicate. The base station 106 may be distributed throughout the cellular network to provide a wide area of coverage. The base station 106 directly communicates to one or a plurality of user devices, other base stations, and one or more core network nodes.

While described in terms of FIG. 1, the present disclosure is not limited to such an environment. The base station 106 may operate on any of the different wireless communication technologies. Example wireless technologies include Global System for Mobile Communication (GSM), Universal Mobile Telecommunications System (UMTS), 3GPP Long Term Evolution (LTE), LTE-Advanced (LTE-A), wireless broadband communication technologies, and others. Example wireless broadband communication systems include IEEE 802.11 wireless local area network, IEEE 802.16 WiMAX network, and others.

While elements of FIGS. 1-7 are shown as including various component parts, portions, or modules that implement the various features and functionality, nevertheless, these elements may instead include a number of submodules, third-party services, components, libraries, and such, as appropriate. Furthermore, the features and functionality of various components can be combined into fewer components as appropriate.

Figure 2:
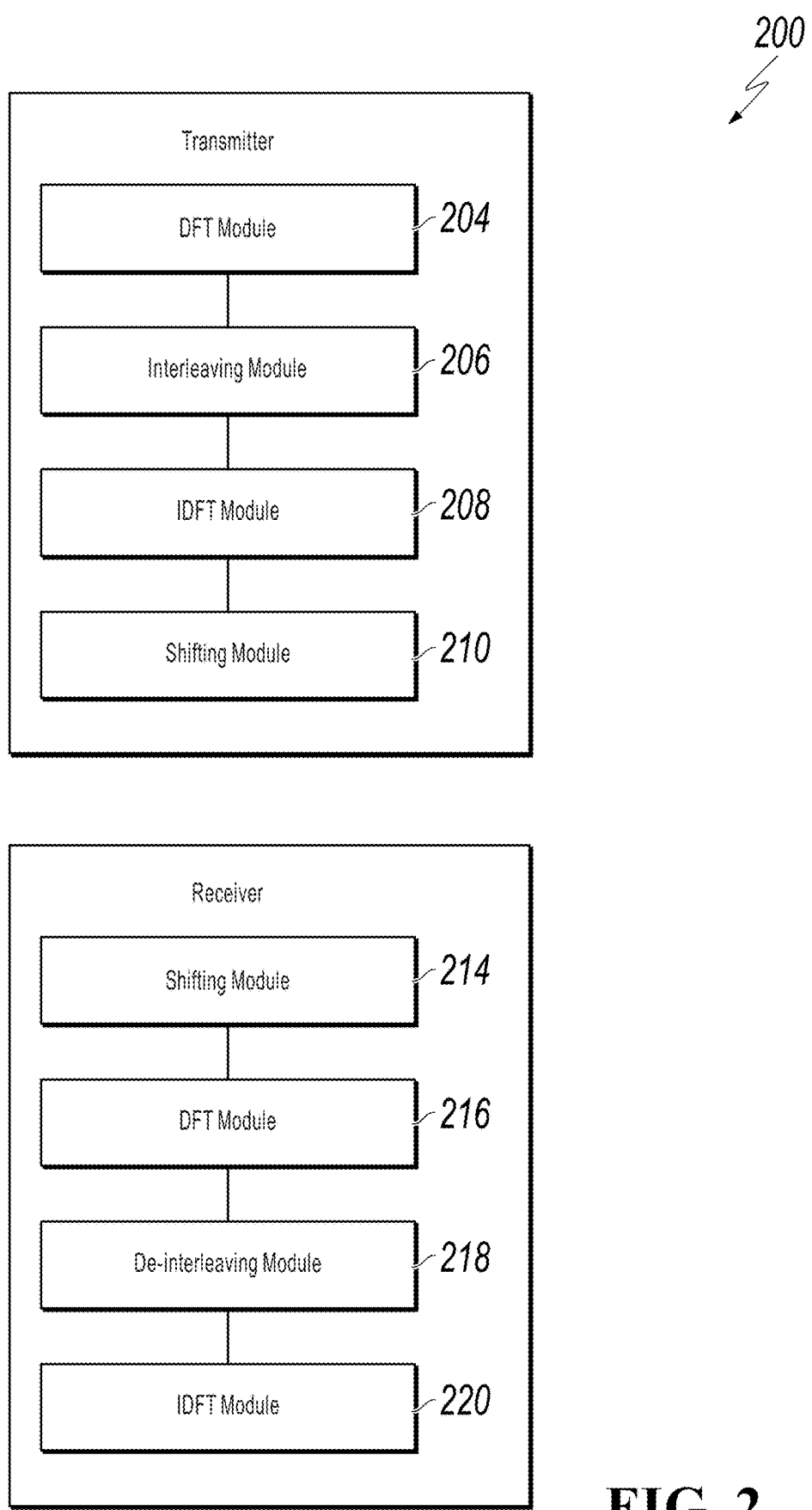
FIG. 2 is a schematic diagram illustrating an example apparatus for multi-user frequency-division multiplexing for block transmissions according to an implementation.

FIG. 2 is a schematic diagram illustrating an example apparatus 200 according to an implementation. In some cases, the example apparatus 200 can be used to perform multi-user frequency-division multiplexing for block transmissions (e.g., MOCZ) to reduce peak-to-average power ratio (PAPR) of a multi-user modulation signal. In some cases, the apparatus 200 can be implemented as an example of the user device 102, 104, and base station 106 of FIG. 1. In some cases, the apparatus 200 may include a transceiver. As depicted, the apparatus 200 includes a transmitter 202 that includes a DFT module 204, an interleaving module 206, an IDFT module 208, and a shifting module 210. In some cases, these modules of the transmitter 202 may be used to generate a multi-user MOCZ signal based on multiple MOCZ symbols for multiple users and send the multi-user MOCZ signal over the network (e.g., network 110 of FIG. 1). The apparatus 200 further includes a receiver 212 that includes a shifting module 214, a DFT module 216, a de-interleaving module 218, and an IDFT module 220. In some cases, these modules of the receiver 212 may be used to receive a multi-user MOCZ signal and separate the MOCZ symbols for respective users.

In some implementations, the multi-user MOCZ transmission described herein can be used in a downlink (DL) transmission, where the transmitter 202 is included in the base station 106 and the receiver 212 is included in the user device 102. In a DL transmission, the base station 106 can super-positioning symbols for multiple users (e.g., MU-S-MOCZ-FDMA symbols as described below with reference to FIG. 3) and transmit the super-positioned signal over the network (e.g., network 110 of FIG. 1). The super-positioned signals can be received by the user device 102. The receiver 212 in the user device 102 can separate its signal from the super-positioned signals as described below. The multi-user MOCZ transmission can also be used in an uplink (UL) transmission, where the transmitter 202 is included in the user device 102 and the receiver 212 is included in the base station 106. In an UL transmission, the user 102 (and user 104) can transmit signals including its MU-S-MOCZ-FDMA symbols at the same time, e.g., in a same frame, subframe, slot, or transmission time interval (TTI). These signals are aggregated over the air and the base station 106 receives the super-positioned signals from multiple user devices. The receiver 212 in the base station 106 can separate the signal from each user from the super-positioned signals.

In some implementations, the multi-user MOCZ transmission can be used in a device-to-device (D2D) transmission, where one or more user devices can transmit signals including the MU-S-MOCZ-FDMA symbols and another one or more user devices can receive and separate the signals including the MU-S-MOCZ-FDMA symbols.

Figure 3:
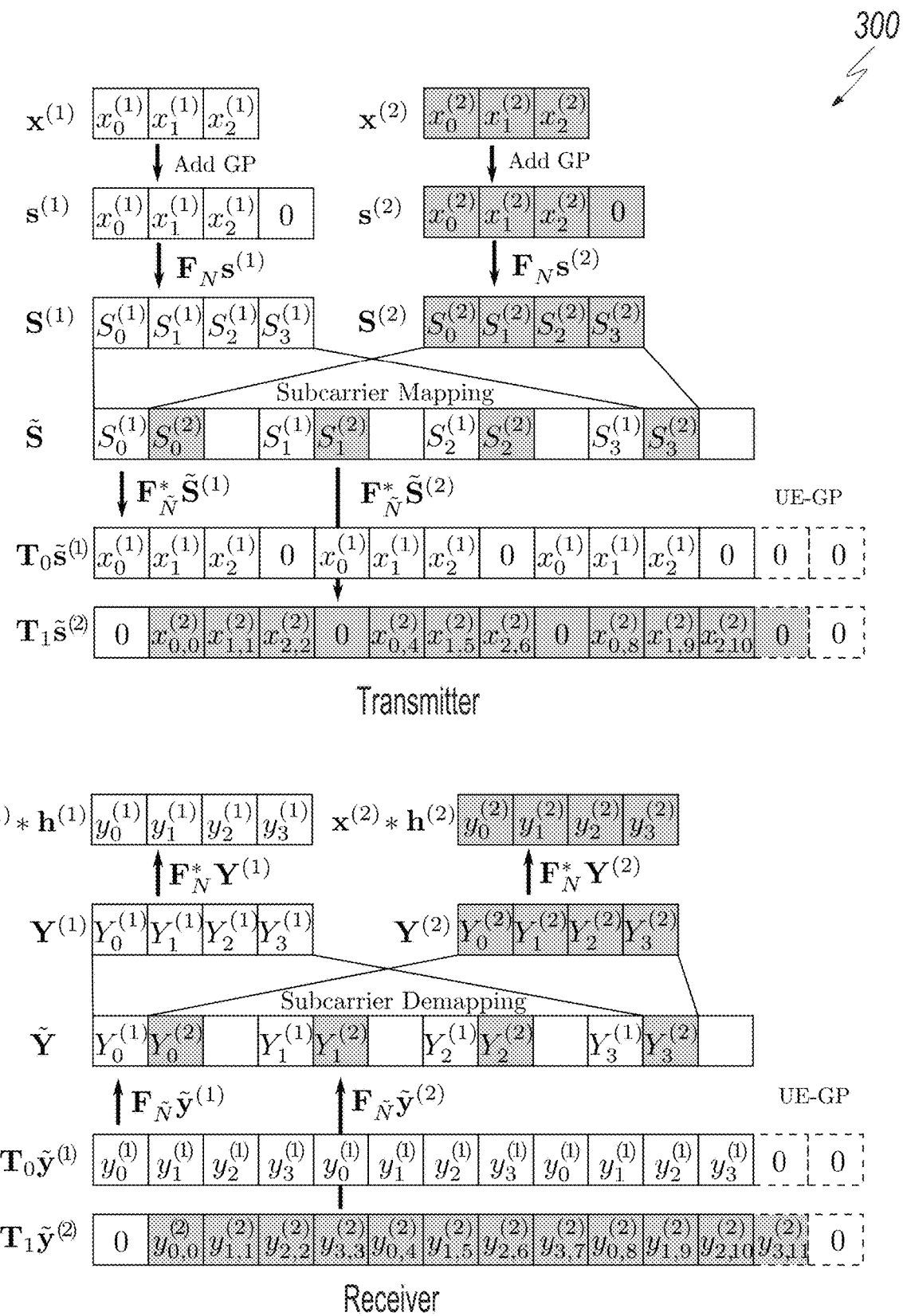
FIG. 3 is a graph illustrating an example process of multi-user frequency-division multiplexing for block transmissions according to an implementation.

FIG. 3 is a graph illustrating an example process 300 of multi-user frequency-division multiplexing for block transmissions according to an implementation. In some cases, the process 300 may be implemented by a user device (e.g., user devices 102 or 104 of FIG. 1) or a base station (e.g., base station 106 of FIG. 1). In some cases, the process 300 may be implemented by any suitable apparatus (e.g., apparatus 200 of FIG. 2).

In some cases, an apparatus may generate one or more MOCZ symbols for one or more users. In some cases, the MOCZ symbol represents a discrete-time baseband signal and may be generated by modulating a message including a number of information bits. The information bits may be encoded in zeros (roots) of a polynomial whose coefficients represent the MOCZ symbol. In some cases, the MOCZ symbol may have a form of $x=(x_0, x_1, \ldots, x_K)$, where K represents the number of zeros of the MOCZ symbol's polynomial. In an example, as depicted, two MOCZ symbols $x^{(1)}$ and $x^{(2)}$ of the same length (e.g., 3 samples as shown in FIG. 3) are generated at a transmitter (e.g., transmitter 202 of FIG. 2). The MOCZ symbol $x^{(1)}$ may be generated for a first user and include samples ($x_0^{(1)}$, $x_1^{(1)}$, $x_2^{(1)}$), and the MOCZ symbol $x^{(2)}$ may be generated for a second user and include samples ($x_0^{(2)}$, $x_1^{(2)}$, $x_2^{(2)}$).

In some cases, a guard period (GP) is inserted into the MOCZ symbols. In some cases, the GP has a length of L−1, where L represents a length of channel impulse response (CIR). In some cases, the insertion of the GP may mitigate inter-symbol-interference caused by a convolution of transmitted time-discrete baseband signal with the CIR on the receiver. In the depicted example, a GP is inserted to the MOCZ symbol $x^{(1)}$ to generate a first MOCZ symbol with GP shown as $s^{(1)}$ that includes samples $(x_0^{(1)}, x_1^{(1)}, x_2^{(1)}, 0)$, where 0 represents the inserted GP. Similarly, a second MOCZ symbol with GP is generated and shown as $s^{(2)}$ that includes samples $(x_0^{(2)}, x_1^{(2)}, x_2^{(2)}, 0)$.

In some cases, the MOCZ symbols with GP are generated in the time-domain. In some cases, a DFT operation is performed on the MOCZ symbols with GP in the time domain to generate a MOCZ symbol with GP in the frequency domain. Continuing with the above example, the MOCZ symbols, $x^{(1)}$ and $x^{(2)}$, and the MOCZ symbols with GP, $s^{(1)}$ and $s^{(2)}$, are generated in the time-domain. The MOCZ symbols with GP in the time domain, e.g., $s^{(1)}$ and $s^{(2)}$, are converted to MOCZ symbols with GP in the frequency domain, e.g., $s^{(1)}$ and $s^{(2)}$, by performing a DFT operation on $s^{(1)}$ and $s^{(2)}$.

In some cases, the DFT samples of the MOCZ symbols with GP in the frequency domain may be interleaved over subcarriers to generate a multi-user MOCZ-FDMA (MU-MOCZ-FDMA) symbol in the frequency domain. In some cases, the DFT samples may be interleaved over $Ñ=U*N$ virtual carriers as follows:

$$\tilde{S}^{(u)}=\Phi_u(S^{(u)})=(0_{u-1}, S_0^{(u)}, 0_{U-1}, S_2^{(u)}, \ldots, S_{N-1}^{(u)}, 0_{U-u}),$$

where U represents a maximal number of supported users in the multi-user MOCZ transmission, N represents the length of the MOCZ symbol with GP, $\Phi_u$ represents a subcarrier mapping for the $u^{th}$ user, and $0_{U-u}$ represents a guard period having a length of (U-u) zeros.

In this example, the MOCZ symbols with GP in the frequency domain $S^{(1)}$ and $S^{(2)}$ are interleaved to generate an MU-MOCZ-FDMA symbol in the frequency domain shown as $\tilde{S}$. In some cases, the frequency-domain MU-MOCZ-FDMA symbol may include MOCZ-FDMA symbols for multiple users in the frequency domain. In this example, the MU-MOCZ-FDMA symbol $\tilde{S}$ includes a first MOCZ-FDMA symbol $\tilde{S}^{(1)}$ for the first user and a second MOCZ-FDMA symbol $\tilde{S}^{(2)}$ for the second user.

In some cases, an IDFT operation may be performed on the MU-MOCZ-FDMA symbol in the frequency domain to generate MOCZ-FDMA symbols in the time domain for a maximal number of U respective users. In this example, time-domain MOCZ-FDMA symbols $\tilde{s}^{(1)}$ and $\tilde{s}^{(2)}$ are generated by applying an IDFT operation on the frequency-domain MOCZ-FDMA symbols $\tilde{S}^{(1)}$ and $\tilde{S}^{(2)}$ for two respective users.

In some cases, the time-domain MOCZ-FDMA symbols may be shifted by a time offset for respective users. In some cases, a shifted-MOCZ-FDMA symbol in the time domain may be generated as $T^{u-1}\tilde{s}^{(u)}$, where $T^{u-1}$ represents a time shift applied on the time-domain MOCZ-FDMA symbol $\tilde{s}^{(u)}$ for the $u^{th}$ user. In this example, a first shifted-MOCZ-FDMA symbol is generated as $T^0\tilde{s}^{(1)}$ for the first user, and a second shifted-MOCZ-FDMA symbol is generated as $T^1\tilde{s}^{(2)}$ for the second user.

In some cases, a multi-user shifted MOCZ-FDMA (MU-S-MOCZ-FDMA) symbol may be generated based on the shifted-MOCZ-FDMA symbols for the multiple users. In some cases, the MU-S-MOCZ-FDMA symbol may be generated by super-positioning the shifted-MOCZ-FDMA symbols for the a maximal number of U multiple users as $$\sum_{u=1}^{U} T^{u-1}\tilde{s}^{(u)}.$$

In some cases, the MU-S-MOCZ-FDMA symbol may be transmitted by the transmitter over the network (e.g., network 110 of FIG. 1), and received by other apparatus so that the MOCZ symbols can be separated by the other apparatus from the MU-S-MOCZ-FDMA symbol as described below.

In some cases, the receiver of the apparatus may receive an MU-S-MOCZ-FDMA symbol over the network. The MU-S-MOCZ-FDMA symbol may include multiple time-domain shifted-MOCZ-FDMA symbols for multiple users. As shown in FIG. 3, the receiver may receive an MU-S-MOCZ-FDMA symbol that includes a first shifted-MOCZ-FDMA symbol $T^0\tilde{y}^{(1)}$ for a first user and a second shifted-MOCZ-FDMA symbol $T^1\tilde{y}^{(2)}$ for a second user, where $\tilde{y}^{(1)}$ and $\tilde{y}^{(2)}$ are the MOCZ-FDMA symbols of respective users in the time domain. In some cases, the received MOCZ-FDMA symbol $\tilde{y}^{(u)}$ (e.g., $\tilde{y}^{(1)}$ and $\tilde{y}^{(2)}$) may include a channel impulse response $h^{(u)}$ for a respective user such that $\tilde{y}^{(u)}=\tilde{s}^{(u)}*h^{(u)}$, where $\tilde{s}^{(u)}$ is the time-domain MOCZ-FDMA symbol as generated on the transmitter. In some cases, a time offset may be applied to the received shifted-MOCZ-FDMA symbol $T^{u-1}\tilde{y}^{(u)}$ to reverse the shift in the symbol $T^{u-1}\tilde{y}^{(u)}$ and obtain the MOCZ-FDMA symbol $\tilde{y}^{(u)}$. In some cases, a DFT operation may be performed on the time-domain MOCZ-FDMA symbol $\tilde{y}^{(u)}$ to generate MOCZ-FDMA symbol $\tilde{Y}^{(u)}$ in the frequency domain. In the depicted example, a DFT operation is performed on the time-domain MOCZ-FDMA symbols $\tilde{y}^{(1)}$ and $\tilde{y}^{(2)}$ to generate frequency-domain MOCZ-FDMA symbols $\tilde{Y}^{(1)}$ and $\tilde{Y}^{(2)}$ that form an MU-MOCZ-FDMA symbol $\tilde{Y}$ in the frequency domain.

In some cases, the frequency-domain MU-MOCZ-FDMA symbol $\tilde{Y}$ may be de-interleaved to generate MOCZ symbols $Y^{(u)}$ in the frequency domain. In some cases, the symbol $\tilde{Y}$ may be de-interleaved as follows: $Y^{(u)}=\Phi_u^{-1}(\tilde{Y}^{(u)})$, where $\tilde{Y}^{(u)}$ is the frequency-domain MOCZ-FDMA symbol of the $u^{th}$ user, and $\Phi_u^{-1}$ represent an inverse subcarrier mapping or the subcarrier de-mapping. In this example, frequency-domain MOCZ symbols $Y^{(1)}$ and $Y^{(2)}$ are generated by de-interleaving the MU-MOCZ-FDMA symbol Y. In some cases, an IDFT operation may be performed on the frequency-domain MOCZ symbols $Y^{(u)}$ to generate the MOCZ symbols $y^{(u)}$ in the time domain, where $y^{(u)}=x^{(u)}*h^{(u)}$ and $x^{(u)}$ is the MOCZ symbol as generated on the transmitter. In some cases, the receiver may decode the time-domain MOCZ symbols $y^{(u)}$ to obtain the data bits that are encoded in zeros (roots) of the polynomial (z-transform) of the MOCZ symbol $x^{(u)}$.

In some cases, the interleaving operation as described herein may introduce a shift in the frequency domain, which results in a phase shift in the time domain. In some cases, the time-domain phase shift may reduce the PAPR of the multi-user MOCZ signal significantly. As noted above, a guard period was added to each MOCZ symbol, which facilitates mitigating inter-block-interference between successive user symbols. The method as described herein allows rewriting the symbols of the separated users in the frequency domain by the discrete Fourier transform of their received baseband signals in time, given by the linear convolution of the users MOCZ symbol with the time-discrete channel impulse response. From the extracted received user signal, the user zeros of the polynomial, generated by the users MOCZ symbol, can be separated from the channel zeros and therefore be uniquely and robustly identified at the receiver.

In some cases, the maximal number of supported users for the multi-user MOCZ transmission as described herein is agreed upon by the transmitter side and the receiver side. In some cases, the length of the MOCZ symbols and the added guard period, thus the length of the MOCZ symbols with GP, as described herein are agreed upon by the transmitter side and the receiver side. In some cases, the transmitter side may send the maximal number of supported users, the length of the MOCZ symbol, and/or the length of the guard period to the receiver side so that the receiver side may perform the operations as described herein, e.g., DFT, de-interleaving, and/or IDFT, based on the information received from the transmitter. In some cases, the number of distinct constellations for encoding a message to the zeros of the polynomial of the MOCZ symbols is agreed upon by the transmitter side and the receiver side so that the receive may decode the message based on the number of the distinct constellations.

In some cases, the symbols generated for their respective users have the same length. For example, the two MOCZ symbols $x^{(1)}$ and $x^{(2)}$ have the same length of three samples. In some cases, a same length of guard period is used to generate the MOCZ symbols with guard period $s^{(u)}$. For example, the MOCZ symbols with guard period $s^{(1)}$ and $s^{(2)}$ include the same length of guard period. As noted, the length of the guard period may be determined based on the length of the channel impulse response to account for the convolution of the MOCZ symbol with the channel impulse response.

Figure 4:
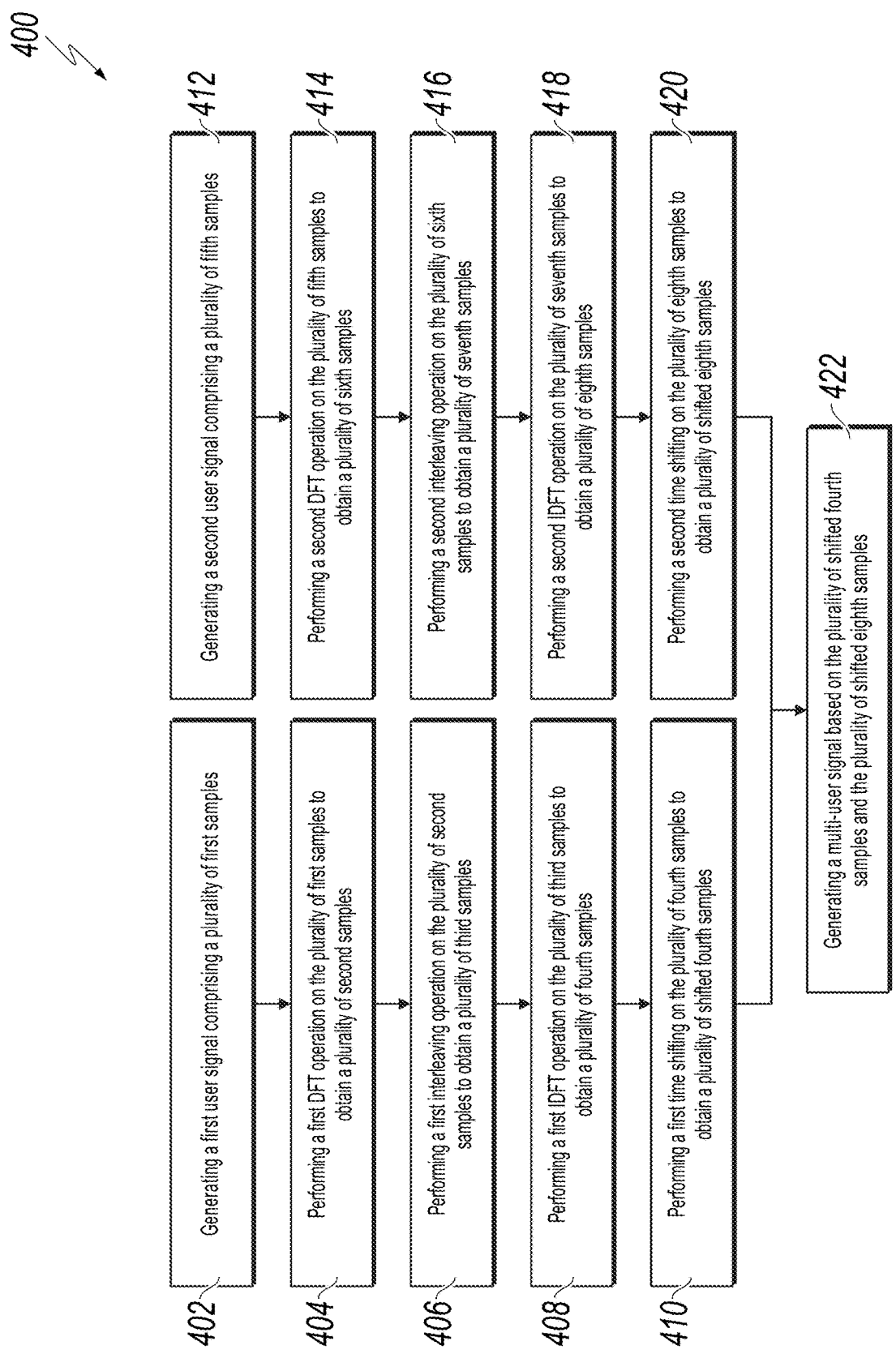
FIG. 4 is a flowchart illustrating an example method of multi-user frequency-division multiplexing for block transmissions according to an implementation.

FIG. 4 is a flowchart illustrating an example method 400 of multi-user frequency-division multiplexing for block transmissions. In some cases, the method 400 may be implemented by a user device (e.g., user devices 102 or 104 of FIG. 1) or a base station (e.g., base station 106 of FIG. 1). In some cases, the method 400 may be implemented by any suitable apparatus (e.g., apparatus 200 of FIG. 2).

The method 400 may begin at block 402, where a first user signal is generated. In some cases, the first user signal may be generated by a user device (e.g., user devices 102 and 104) in uplink communication. In some cases, the first user signal may be generated by a base station (e.g., base station 106) in downlink communication. In some cases, the first user signal (e.g., MOCZ symbol with GP $s^{(1)}$ of FIG. 3) may be generated based on a first discrete-time baseband signal and a first determined guard period, and include a number of first samples (e.g., samples $(x_0^{(1)}, x_1^{(1)}, x_2^{(1)}, 0)$ of FIG. 3). In some cases, the first discrete-time baseband signal may include a MOCZ symbol (e.g., MOCZ symbol $x^{(1)}$ of FIG. 3).

At block 404, a first DFT operation is performed on the number of first samples to obtain a number of second samples. For example, a DFT operation may be performed on the samples of the time-domain MOCZ symbol with GP $s^{(1)}$ to obtain samples of the frequency-domain MOCZ symbol with GP $S^{(1)}$.

At block 406, a first interleaving operation is performed on the number of second samples to obtain a number of third samples. For example, an interleaving operation may be performed on the samples of the frequency-domain MOCZ symbol with GP $S^{(1)}$ to obtain a sample of the frequency-domain MOCZ-FDMA symbol $\tilde{S}^{(1)}$.

At block 408, a first IDFT operation is performed on the number of third samples to obtain a number of fourth samples. For example, an IDFT operation may be performed on the samples of the frequency-domain MOCZ-FDMA symbol $\tilde{S}^{(1)}$ to obtain samples of the time-domain MOCZ-FDMA symbol $\tilde{s}^{(1)}$.

At block 410, a first time shifting is performed on the number of fourth samples to obtain a number of shifted fourth samples. For example, a translation $T^{(0)}$ may be applied to the samples of the time-domain MOCZ-FDMA symbol $\tilde{s}^{(1)}$ to obtain samples of the time-domain shifted-MOCZ-FDMA symbol $T^0\tilde{s}^{(1)}$.

The operations in blocks 412-420 are analogous to the operations as described in blocks 402-410. In some cases, operations in blocks 412-420 may be performed by a user device (e.g., user device 104 of FIG. 1) that is different from another user device (e.g., user device 102 of FIG. 1) that performs the operations in blocks 402-410. In some cases, operations in blocks 412-420 may be performed by a base station (e.g., base station 106) that is the same as a base station that performs the operations in blocks 402-410. At block 412, a second user signal (e.g., MOCZ symbol with GP $s^{(2)}$ of FIG. 3) is generated to include a number of fifth samples (e.g., samples $(x_0^{(2)}, x_1^{(2)}, x_2^{(2)}, 0)$ of FIG. 3). At block 414, a second DFT operation is performed on the number of fifth samples to obtain a number of sixth samples (e.g., samples of the frequency-domain MOCZ symbol with GP $S^{(2)}$). At block 416, a second interleaving operation is performed on the number of sixth samples to obtain a number of seventh samples (e.g., samples of the frequency-domain MOCZ-FDMA symbol $\tilde{S}^{(2)}$). At block 418, a second IDFT operation is performed on the number of seventh samples to obtain a number of eighth samples (e.g., samples of the time-domain MOCZ-FDMA symbol $\tilde{s}^{(2)}$). At block 420, a second time shifting is performed on the number of eighth samples to obtain a number of shifted eighth samples (e.g., samples of the time-domain shifted-MOCZ-FDMA symbol $T^1\tilde{s}^{(2)}$).

At block 422, a multi-user signal is generated based on the number of shifted fourth samples and the number of shifted eighth samples. In some cases, a base station (e.g., base station 106) may generate an MU-S-MOCZ-FDMA signal (e.g., $$\sum_{u=1}^{U} T^{u-1}\tilde{s}^{(u)}$$

) based on shifted-MOCZ-FDMA generated for respective users (e.g., $T^0\tilde{s}^{(1)}$ and $T^1\tilde{s}^{(2)}$). In some cases, the base station may further transmit the multi-user signal over the network to be received by user devices.

Figure 5:
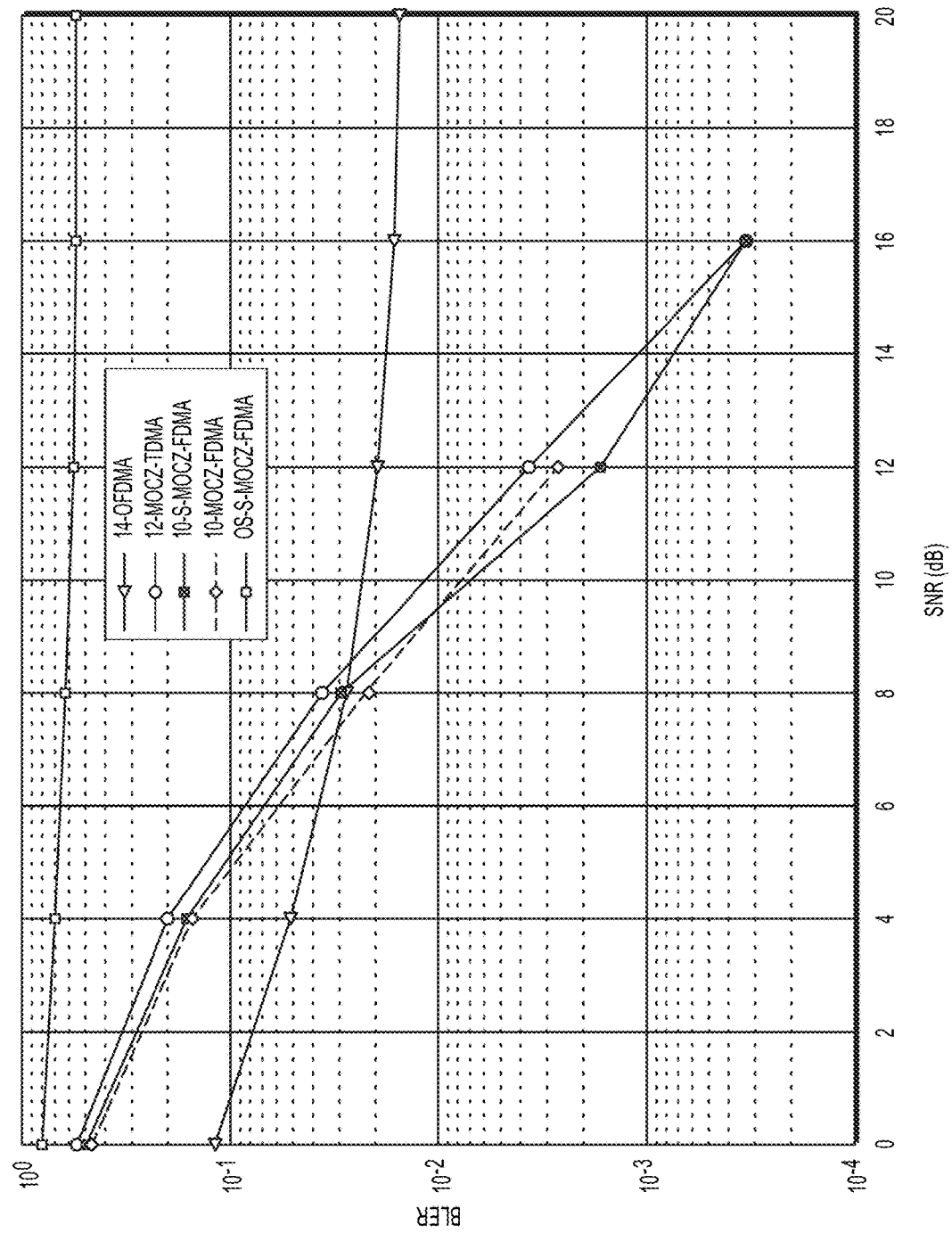
FIG. 5 is a graph illustrating a comparison of performance of an example scheme of multi-user frequency-division multiplexing for block transmissions with other multiplexing schemes according to an implementation.

FIG. 5 is a graph illustrating a comparison of the performance of the disclosed multi-user frequency-division multiplexing scheme for block transmissions with other multiplexing schemes. FIG. 5 shows the BLER (block error rate) vs. SNR (signal-to-noise ratio) performance for one example with 14 ODFMA symbols, 12 MOCZ-FDMA symbols, 10 S-MOCZ-FDMA (shifted-MOCZ-FDMA) symbols, 10 MOCZ-FDMA symbols, and one OS-S-MOCZ-FDMA (one-shot S-MOCZ-FDMA) symbol, respectively. As shown, OFDMA suffers dramatically in performance, while TDMA and S-MOCZ-FDMA can actually utilize the channel diversity.

Figure 6:
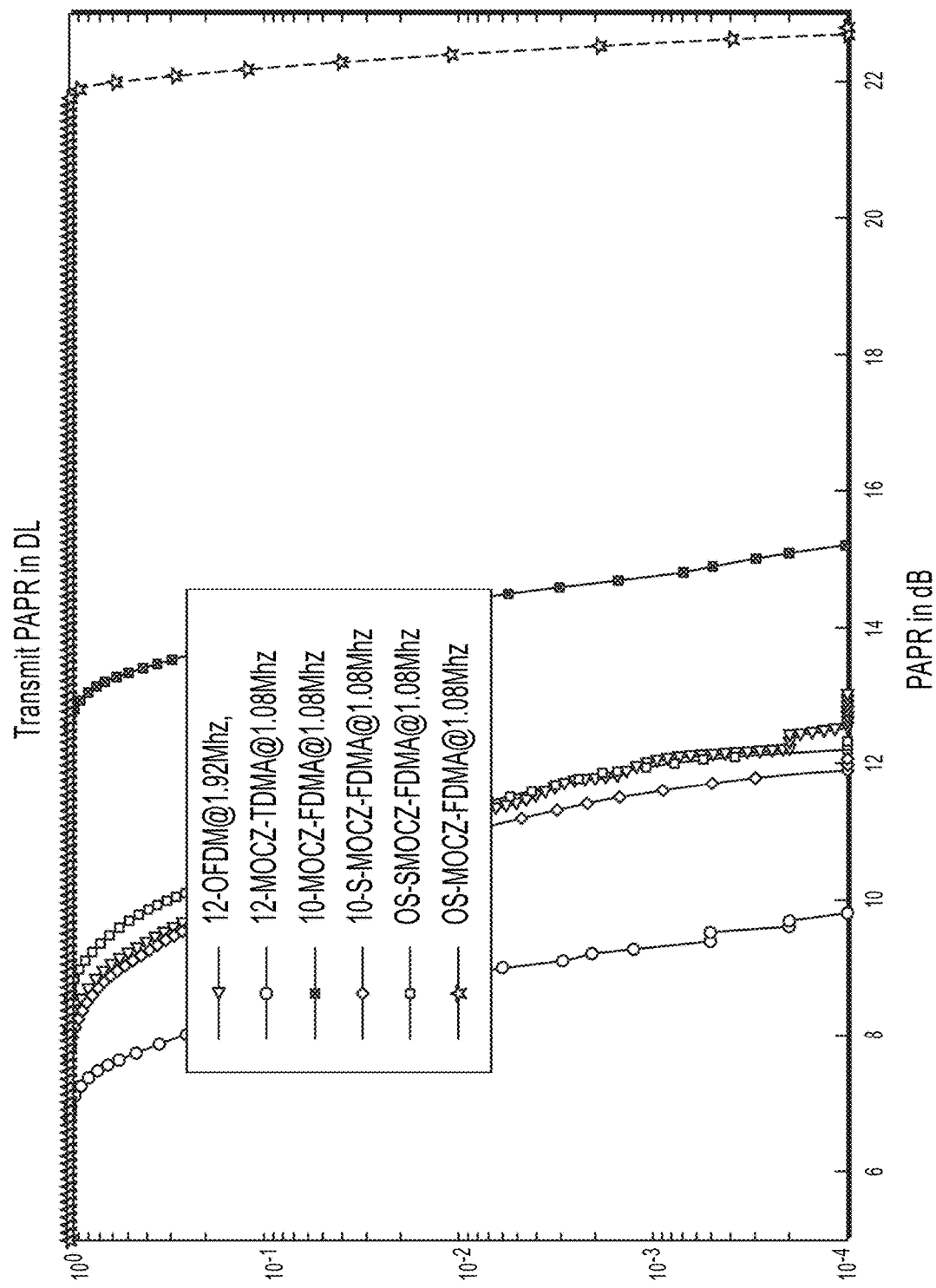
FIG. 6 is a graph illustrating a comparison of performance of an example scheme of multi-user frequency-division multiplexing for block transmissions with other multiplexing schemes according to an implementation.

FIG. 6 is a graph illustrating a comparison of the performance of the disclosed multi-user frequency-division multiplexing scheme for block transmissions with other multiplexing schemes. FIG. 6 shows CDF (cumulative distribution function) vs. PAPR (peak-to-average-power ratio) performance for 12 OFDMA symbols, 12 MOCZ-TDMA symbols, 10 MOCZ-FDMA symbols, 10 S-MOCZ-FDMA symbols, one OS-S-MOCZ-FDMA symbol, and one OS-MOCZ-FDMA symbol, respectively. As shown, the S-MOCZ-FDMA has a better overall performance. Therefore, the additional guard period inserted in the MOCZ symbol prevents interferences with successive S-MOCZ-FDMA symbols, thereby improving the PAPR performance.

Figure 7:
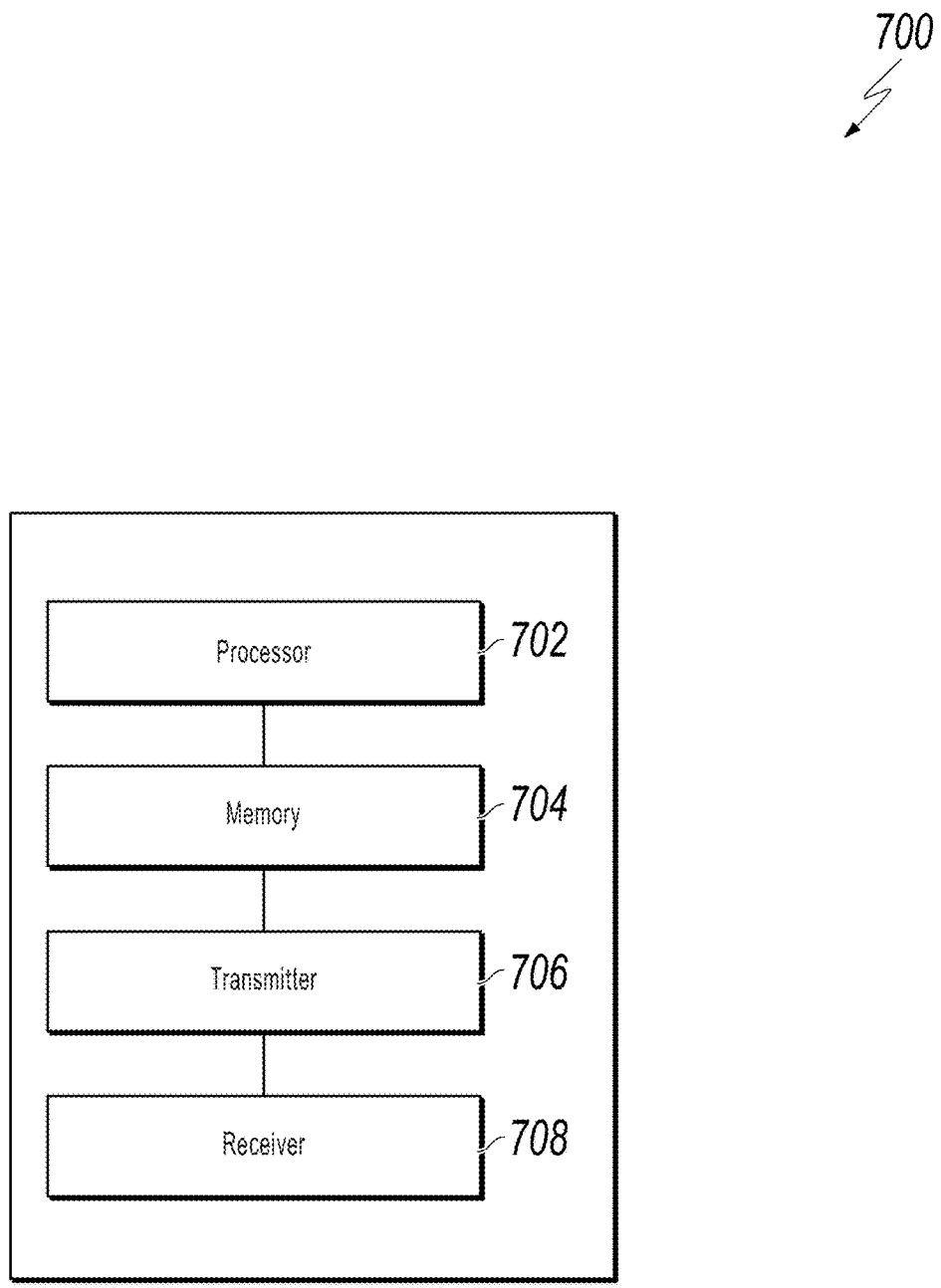
FIG. 7 is a schematic diagram illustrating an example structure of an electronic device according to an implementation.

FIG. 7 is a schematic diagram illustrating an example structure of an electronic device 700 described in the present disclosure, according to an implementation. In some cases, the electronic device 700 can be implemented as an example of the user device 102 or 104 or the base station 106 of FIG. 1. As shown, the electronic device 700 includes one or more processors 702, a memory 704, a transmitter 706, and a receiver 708. In some implementations, electronic device 700 can further include one or more circuits/components for performing any one or a combination of steps described in the present disclosure. For example, the electronic device 700 may further include a modulator for modulating a signal and a demodulator for demodulating a signal. In some cases, each of the transmitter 706 and receiver 708 may include a modulator and/or demodulator.

It is expressly understood that the described implementations of the subject matter can include one or more features, alone or in combination. For example, in a first implementation, a method for multi-user frequency-division multiplexing for block transmissions includes: generating a first user signal comprising a plurality of first samples in the time domain, the plurality of first samples are generated based on a first discrete-time baseband signal and a first predetermined guard period; performing a first discrete Fourier transform (DFT) operation on the plurality of first samples to obtain a plurality of second samples in the frequency domain; performing a first interleaving operation on the plurality of second samples to obtain a plurality of third samples in the frequency domain; performing a first inverse-DFT (IDFT) operation on the plurality of third samples to obtain a plurality of fourth samples in the time domain; performing a first time shifting on the plurality of fourth samples to obtain a plurality of shifted fourth sample; and sending a block transmission using the shifted fourth samples.

The foregoing and other described implementations can each, optionally, include one or more of the following features described below. It is contemplated that these features may be combined with one or more of the forgoing implementations.

A first feature, combinable with any of the following features, where the method further includes: generating a second user signal comprising a plurality of fifth samples in time domain, the plurality of fifth samples are generated based on a second discrete-time baseband signal and a second predetermined guard period; performing a second DFT operation on the plurality of fifth samples to obtain a plurality of sixth samples in frequency domain; performing a second interleaving operation on the plurality of sixth samples to obtain a plurality of seventh samples in frequency domain; performing a second IDFT operation on the plurality of seventh samples to obtain a plurality of eighth samples in time domain; performing a second time shifting on the plurality of eighth samples to obtain a plurality of shifted eighth samples; and generating a multi-user signal based on the plurality of shifted fourth samples and the plurality of shifted eighth samples.

A second feature, combinable with any of the previous or following features, where performing the first time shifting on the plurality of fourth samples comprises applying a first time offset to the plurality of fourth samples, where performing the second time shifting on the plurality of eighth samples comprises applying a second time offset to the plurality of eighth samples, and where the first time offset is different from the second time offset.

A third feature, combinable with any of the previous or following features, where a length of the first predetermined guard period is determined based on a length of channel impulse response (CIR).

A fourth feature, combinable with any of the previous or following features, where the first discrete-time baseband signal comprises a modulation on conjugate-reciprocal zeros (MOCZ) symbol.

A fifth feature, combinable with any of the previous or following features, where the first discrete-time baseband signal is obtained by modulating a plurality of information bits, and the plurality of information bits are encoded in zeros of a polynomial whose coefficients represent the first discrete-time baseband signal.

A sixth feature, combinable with any of the previous or following features, where performing the first interleaving operation on the plurality of second samples comprises interleaving the plurality of second samples over a plurality of subcarriers.

In a second implementation, an electronic device includes: a non-transitory memory storage comprising instructions; and one or more hardware processors in communication with the memory storage, wherein the one or more hardware processors execute the instructions to perform operations including: generating a first user signal comprising a plurality of first samples in time domain, the plurality of first samples are generated based on a first discrete-time baseband signal and a first predetermined guard period; performing a first discrete Fourier transform (DFT) operation on the plurality of first samples to obtain a plurality of second samples in frequency domain; performing a first interleaving operation on the plurality of second samples to obtain a plurality of third samples in frequency domain; performing a first inverse-DFT (IDFT) operation on the plurality of third samples to obtain a plurality of fourth samples in time domain; performing a first time shifting on the plurality of fourth samples to obtain a plurality of shifted fourth sample; and sending a block transmission using the shifted fourth samples.

The foregoing and other described implementations can each, optionally, include one or more of the following features:

A first feature, combinable with any of the following features, where the operations further include: generating a second user signal comprising a plurality of fifth samples in time domain, the plurality of fifth samples are generated based on a second discrete-time baseband signal and a second predetermined guard period; performing a second DFT operation on the plurality of fifth samples to obtain a plurality of sixth samples in frequency domain; performing a second interleaving operation on the plurality of sixth samples to obtain a plurality of seventh samples in frequency domain; performing a second IDFT operation on the plurality of seventh samples to obtain a plurality of eighth samples in time domain; performing a second time shifting on the plurality of eighth samples to obtain a plurality of shifted eighth samples; and generating a multi-user signal based on the plurality of shifted fourth samples and the plurality of shifted eighth samples.

A second feature, combinable with any of the previous or following features, where performing the first time shifting on the plurality of fourth samples comprises applying a first time offset to the plurality of fourth samples, where performing the second time shifting on the plurality of eighth samples comprises applying a second time offset to the plurality of eighth samples, and where the first time offset is different from the second time offset.

A third feature, combinable with any of the previous or following features, where a length of the first predetermined guard period is determined based on a length of channel impulse response (CIR).

A fourth feature, combinable with any of the previous or following features, where the first discrete-time baseband signal comprises a modulation on conjugate-reciprocal zeros (MOCZ) symbol.

A fifth feature, combinable with any of the previous or following features, where the first discrete-time baseband signal is obtained by modulating a plurality of information bits, and the plurality of information bits are encoded in zeros of a polynomial whose coefficients represent the first discrete-time baseband signal.

A sixth feature, combinable with any of the previous or following features, where performing the first interleaving operation on the plurality of second samples comprises interleaving the plurality of second samples over a plurality of subcarriers.

In a third implementation, a non-transitory computer-readable medium storing computer instructions for multi-user MOCZ, that when executed by one or more hardware processors, cause the one or more hardware processors to perform operations including: generating a first user signal comprising a plurality of first samples in time domain, the plurality of first samples are generated based on a first discrete-time baseband signal and a first predetermined guard period; performing a first discrete Fourier transform (DFT) operation on the plurality of first samples to obtain a plurality of second samples in frequency domain; performing a first interleaving operation on the plurality of second samples to obtain a plurality of third samples in frequency domain; performing a first inverse-DFT (IDFT) operation on the plurality of third samples to obtain a plurality of fourth samples in time domain; performing a first time shifting on the plurality of fourth samples to obtain a plurality of shifted fourth sample; and sending a block transmission using the shifted fourth samples.

The foregoing and other described implementations can each, optionally, include one or more of the following features:

A first feature, combinable with any of the following features, where the operations further include: generating a second user signal comprising a plurality of fifth samples in time domain, the plurality of fifth samples are generated based on a second discrete-time baseband signal and a second predetermined guard period; performing a second DFT operation on the plurality of fifth samples to obtain a plurality of sixth samples in frequency domain; performing a second interleaving operation on the plurality of sixth samples to obtain a plurality of seventh samples in frequency domain; performing a second IDFT operation on the plurality of seventh samples to obtain a plurality of eighth samples in time domain; performing a second time shifting on the plurality of eighth samples to obtain a plurality of shifted eighth samples; and generating a multi-user signal based on the plurality of shifted fourth samples and the plurality of shifted eighth samples.

A second feature, combinable with any of the previous or following features, where performing the first time shifting on the plurality of fourth samples comprises applying a first time offset to the plurality of fourth samples, where performing the second time shifting on the plurality of eighth samples comprises applying a second time offset to the plurality of eighth samples, and where the first time offset is different from the second time offset.

A third feature, combinable with any of the previous or following features, where a length of the first predetermined guard period is determined based on a length of channel impulse response (CIR).

A fourth feature, combinable with any of the previous or following features, where the first discrete-time baseband signal comprises a modulation on conjugate-reciprocal zeros (MOCZ) symbol.

A fifth feature, combinable with any of the previous or following features, where the first discrete-time baseband signal is obtained by modulating a plurality of information bits, and the plurality of information bits are encoded in zeros of a polynomial whose coefficients represent the first discrete-time baseband signal.

A sixth feature, combinable with any of the previous or following features, where performing the first interleaving operation on the plurality of second samples comprises interleaving the plurality of second samples over a plurality of subcarriers.

Implementations of the subject matter and the functional operations described in this specification can be implemented in digital electronic circuitry, intangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," and "computer," (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be or further include special purpose logic circuitry, for example, a Central Processing Unit (CPU), a Field Programmable Gate Array (FPGA), or an Application-specific Integrated Circuit (ASIC). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components, as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a ROM or a Random Access Memory (RAM), or both. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a Personal Digital Assistant (PDA), a mobile audio or video player, a game console, a Global Positioning System (GPS) receiver, or a portable storage device, for example, a Universal Serial Bus (USB) flash drive, to name just a few.

Computer-readable media (transitory or non-transitory, as appropriate) suitable for storing computer program instructions and data includes non-volatile memory, media and memory devices, including byway of example, semiconductor memory devices, for example, Erasable Programmable Read-Only Memory (EPROM), Electrically Erasable Programmable Read-Only Memory (EEPROM), and flash memory devices; magnetic disks, for example, internal hard disks or removable disks; magneto-optical disks; and CD-ROM, DVD+/−R, DVD-RAM, and DVD-ROM disks. The memory may store various objects or data, including caches, classes, frameworks, applications, backup data, jobs, web pages, web page templates, database tables, repositories storing dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a Cathode Ray Tube (CRT), Liquid Crystal Display (LCD), Light Emitting Diode (LED), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a Local Area Network (LAN), a Radio Access Network (RAN), a Metropolitan Area Network (MAN), a Wide Area Network (WAN), Worldwide Interoperability for Microwave Access (WIMAX), a Wireless Local Area Network (WLAN) using, for example, 802.11 a/b/g/n or 802.20 (or a combination of 802.11x and 802.20 or other protocols consistent with this disclosure), any cellular network systems, such as LTE (Long-term-evolutions), 5G NR (new radio), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A method comprising:
    generating, by an electronic device, a first user signal comprising a plurality of first samples in the time domain, the plurality of first samples are generated based on a first discrete-time baseband signal and a first predetermined guard period;
    performing, by the electronic device, a first discrete Fourier transform (DFT) operation on the plurality of first samples to obtain a plurality of second samples in the frequency domain;
    performing, by the electronic device, a first interleaving operation on the plurality of second samples to obtain a plurality of third samples in the frequency domain;
    performing, by the electronic device, a first inverse-DFT (IDFT) operation on the plurality of third samples to obtain a plurality of fourth samples in the time domain;
    performing, by the electronic device, a first time shifting on the plurality of fourth samples to obtain a plurality of shifted fourth samples;
    sending a block transmission using the plurality of shifted fourth samples;
    generating a second user signal comprising a plurality of fifth samples in the time domain, the plurality of fifth samples are generated based on a second discrete-time baseband signal and a second predetermined guard period;
    performing a second DFT operation on the plurality of fifth samples to obtain a plurality of sixth samples in the frequency domain;
    performing a second interleaving operation on the plurality of sixth samples to obtain a plurality of seventh samples in the frequency domain;
    performing a second IDFT operation on the plurality of seventh samples to obtain a plurality of eighth samples in the time domain;
    performing a second time shifting on the plurality of eighth samples to obtain a plurality of shifted eighth samples; and
    generating a multi-user signal based on the plurality of shifted fourth samples and the plurality of shifted eighth samples,
    wherein the performing the first time shifting on the plurality of fourth samples comprises:
    applying a first time offset to the plurality of fourth samples, and wherein performing the second time shifting on the plurality of eighth samples comprises:
    applying a second time offset to the plurality of eighth samples, and wherein the first time offset is different from the second time offset.

2. The method according to claim 1, wherein a length of the first predetermined guard period is determined based on a length of channel impulse response (CIR).

3. The method according to claim 1, wherein the first discrete-time baseband signal comprises a modulation on conjugate-reciprocal zeros (MOCZ) symbol.

4. The method according to claim 1, wherein the first discrete-time baseband signal is obtained by modulating a plurality of information bits, and wherein the plurality of information bits are encoded in zeros of a polynomial whose coefficients represent the first discrete-time baseband signal.

5. The method according to claim 1, wherein performing the first interleaving operation on the plurality of second samples comprises interleaving the plurality of second samples over a plurality of subcarriers.

6. An electronic device, comprising:
    a non-transitory memory storage comprising instructions; and
    one or more hardware processors in communication with the non-transitory memory storage, wherein the one or more hardware processors execute the instructions to perform operations comprising:
    generating a first user signal comprising a plurality of first samples in the time domain, the plurality of first samples are generated based on a first discrete-time baseband signal and a first predetermined guard period;
    performing a first discrete Fourier transform (DFT) operation on the plurality of first samples to obtain a plurality of second samples in the frequency domain;

performing a first interleaving operation on the plurality of second samples to obtain a plurality of third samples in the frequency domain;

performing a first inverse-DFT (IDFT) operation on the plurality of third samples to obtain a plurality of fourth samples in the time domain;

performing a first time shifting on the plurality of fourth samples to obtain a plurality of shifted fourth samples;

sending a block transmission using the plurality of shifted fourth samples;

generating a second user signal comprising a plurality of fifth samples in the time domain, the plurality of fifth samples are generated based on a second discrete-time baseband signal and a second predetermined guard period;

performing a second DFT operation on the plurality of fifth samples to obtain a plurality of sixth samples in the frequency domain;

performing a second interleaving operation on the plurality of sixth samples to obtain a plurality of seventh samples in the frequency domain;

performing a second IDFT operation on the plurality of seventh samples to obtain a plurality of eighth samples in the time domain;

performing a second time shifting on the plurality of eighth samples to obtain a plurality of shifted eighth samples; and generating a multi-user signal based on the plurality of shifted fourth samples and the plurality of shifted eighth samples, wherein the performing the first time shifting on the plurality of fourth samples comprises:

applying a first time offset to the plurality of fourth samples, and wherein the performing the second time shifting on the plurality of eighth samples comprises:

applying a second time offset to the plurality of eighth samples, and wherein the first time offset is different from the second time offset.

7. The electronic device according to claim 6, wherein a length of the first predetermined guard period is determined based on a length of channel impulse response (CIR).

8. The electronic device according to claim 6, wherein the first discrete-time baseband signal comprises a modulation on conjugate-reciprocal zeros (MOCZ) symbol.

9. The electronic device according to claim 6, wherein the first discrete-time baseband signal is obtained by modulating a plurality of information bits, and wherein the plurality of information bits are encoded in zeros of a polynomial whose coefficients represent the first discrete-time baseband signal.

10. The electronic device according to claim 6, wherein performing the first interleaving operation on the plurality of second samples comprises interleaving the plurality of second samples over a plurality of subcarriers.

11. A non-transitory computer-readable medium storing computer instructions, that when executed by an electronic device, cause the electronic device to perform operations comprising:

generating a first user signal comprising a plurality of first samples in the time domain, the plurality of first samples are generated based on a first discrete-time baseband signal and a first predetermined guard period;

performing a first discrete Fourier transform (DFT) operation on the plurality of first samples to obtain a plurality of second samples in the frequency domain;

performing a first interleaving operation on the plurality of second samples to obtain a plurality of third samples in the frequency domain;

performing a first inverse-DFT (IDFT) operation on the plurality of third samples to obtain a plurality of fourth samples in the time domain;

performing a first time shifting on the plurality of fourth samples to obtain a plurality of shifted fourth samples;

sending a block transmission using the plurality of shifted fourth samples;

generating a second user signal comprising a plurality of fifth samples in the time domain, the plurality of fifth samples are generated based on a second discrete-time baseband signal and a second predetermined guard period;

performing a second DFT operation on the plurality of fifth samples to obtain a plurality of sixth samples in the frequency domain;

performing a second interleaving operation on the plurality of sixth samples to obtain a plurality of seventh samples in the frequency domain;

performing a second IDFT operation on the plurality of seventh samples to obtain a plurality of eighth samples in the time domain;

performing a second time shifting on the plurality of eighth samples to obtain a plurality of shifted eighth samples; and generating a multi-user signal based on the plurality of shifted fourth samples and the plurality of shifted eighth samples, wherein the performing the first time shifting on the plurality of fourth samples comprises:

applying a first time offset to the plurality of fourth samples, and wherein the performing the second time shifting on the plurality of eighth samples comprises:

applying a second time offset to the plurality of eighth samples, and wherein the first time offset is different from the second time offset.

12. The non-transitory computer-readable medium according to claim 11, wherein a length of the first predetermined guard period is determined based on a length of channel impulse response (CIR).

13. The non-transitory computer-readable medium according to claim 11, wherein the first discrete-time baseband signal comprises a modulation on conjugate-reciprocal zeros (MOCZ) symbol.

14. The non-transitory computer-readable medium according to claim 11, wherein the first discrete-time baseband signal is obtained by modulating a plurality of information bits, and wherein the plurality of information bits are encoded in zeros of a polynomial whose coefficients represent the first discrete-time baseband signal.

* * * * *